United States Patent
Brindani et al.

(10) Patent No.: US 11,804,807 B2
(45) Date of Patent: Oct. 31, 2023

(54) COST EFFECTIVE HYBRID PROTECTION FOR HIGH POWER AMPLIFIER

(71) Applicants: WHIRLPOOL CORPORATION, Benton Harbor, MI (US); Panasonic Corporation, Osaka (JP)

(72) Inventors: Franco Brindani, Ternate (IT); Natalia Roumpedaki, Ternate (IT)

(73) Assignee: Whirlpool Corporation Panasonic Holdings Corporation, Benton Harbor, MI (US)

( * ) Notice: Subject to any disclaimer, the term of this patent is extended or adjusted under 35 U.S.C. 154(b) by 578 days.

(21) Appl. No.: 16/312,329

(22) PCT Filed: Dec. 30, 2016

(86) PCT No.: PCT/US2016/069372
§ 371 (c)(1),
(2) Date: Dec. 21, 2018

(87) PCT Pub. No.: WO2018/125182
PCT Pub. Date: Jul. 5, 2018

(65) Prior Publication Data
US 2019/0312555 A1    Oct. 10, 2019

(51) Int. Cl.
*H03F 1/52* (2006.01)
*H05B 6/68* (2006.01)
(Continued)

(52) U.S. Cl.
CPC ............... *H03F 1/52* (2013.01); *H05B 6/64* (2013.01); *H05B 6/681* (2013.01); *H05B 6/686* (2013.01);
(Continued)

(58) Field of Classification Search
CPC .. H05B 6/686; H05B 6/705; H05B 2206/044; H05B 6/806; H05B 6/707; H05B 6/701;
(Continued)

(56) References Cited

U.S. PATENT DOCUMENTS

| | | | |
|---|---|---|---|
| 8,796,593 B2 | 8/2014 | Okajima | |
| 2004/0004074 A1* | 1/2004 | Torngren | H05B 6/70 219/678 |

(Continued)

FOREIGN PATENT DOCUMENTS

| | | |
|---|---|---|
| CN | 102355203 A | 2/2012 |
| DE | 102004018137 A1 | 10/2005 |

(Continued)

*Primary Examiner* — Sang Y Paik
*Assistant Examiner* — Erwin J Wunderlich
(74) *Attorney, Agent, or Firm* — Price Heneveld LLP

(57) ABSTRACT

An RF generation system is provided for an electromagnetic cooking device having a cavity. The system includes: a signal generator for generating an input RF signal; an RF feed configured to introduce electromagnetic radiation into the cavity and to receive reflected electromagnetic radiation from the cavity; and a high-power amplifier coupled between the signal generator and the RF feed. The high-power amplifier including an amplifying stage configured to output a signal that is amplified in power, and a circulator for directing the amplified output signal to the RF feed and for redirecting any reflected radiation received from the RF feed to a dummy load. The system further includes a hardware protection component for detecting backward power in the reflected radiation and for reducing power supplied to the amplifying stage if the backward power exceeds a power threshold within a time scale that prevents damage to the circulator.

17 Claims, 3 Drawing Sheets

(51) Int. Cl.
  *H05B 6/70* (2006.01)
  *H05B 6/72* (2006.01)
  *H05B 6/64* (2006.01)

(52) U.S. Cl.
  CPC .............. *H05B 6/70* (2013.01); *H05B 6/705* (2013.01); *H05B 6/72* (2013.01); *Y02B 40/00* (2013.01)

(58) Field of Classification Search
  CPC ... H05B 6/00; H05B 6/66; H05B 6/68; H05B 6/70; H05B 6/64; H05B 6/681; H05B 6/72; H04B 1/74; H03F 1/52; Y02B 40/00
  See application file for complete search history.

(56) References Cited

U.S. PATENT DOCUMENTS

2008/0266012 A1   10/2008   Yahata et al.
2011/0108548 A1*  5/2011   Nobue ................... H05B 6/705
                                                                       219/702
2016/0183332 A1   6/2016   Frank et al.

FOREIGN PATENT DOCUMENTS

| | | |
|---|---|---|
| EP | 3549396 B1 | 9/2020 |
| EP | 3563638 B1 | 9/2021 |
| JP | 1989-054913 A | 3/1989 |
| JP | H05327363 A | 12/1993 |
| JP | 2000-223962 | 8/2000 |
| JP | 2003347875 A | 12/2003 |
| JP | 2009159251 A | 7/2009 |
| JP | 2010021644 A | 1/2010 |
| JP | 2017504158 A | 2/2017 |
| JP | 2018522372 A | 8/2018 |
| WO | 2007080859 A1 | 7/2007 |
| WO | 2015099649 A1 | 7/2015 |
| WO | 2015099650 A1 | 7/2015 |
| WO | WO-2015099649 A1 * | 7/2015 ............. H05B 6/666 |
| WO | 2016144872 A1 | 9/2016 |
| WO | 2016196939 A1 | 12/2016 |

* cited by examiner

COST EFFECTIVE HYBRID PROTECTION FOR HIGH POWER AMPLIFIER

BACKGROUND

The present device generally relates to an RF energy transmission system for an electromagnetic cooking device, and more specifically, to an RF energy transmission system for a solid state RF electromagnetic cooking device having protection for a high power amplifier from reflected electromagnetic waves.

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer of a high-power amplifier results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron can result in non-uniform heating of the food. To more evenly heat food, microwave ovens include, among other things, mechanical solutions such as a microwave stirrer and a turntable for rotating the food. A common magnetron-based microwave source is not narrowband and not tunable (i.e. emits microwaves at a frequency that is changing over time and not selectable). As an alternative to such a common magnetron-based microwave source, solid-state sources can be included in microwave ovens which are tunable and coherent.

SUMMARY

In one aspect, a solid state radio frequency generation system is provided for an electromagnetic cooking device having an enclosed cavity in which a food load is placed. The solid state radio frequency generation system comprises: a small signal generator for generating an input RF signal; an RF feed configured to introduce electromagnetic radiation into the enclosed cavity to heat up and prepare the food load, the RF feed configured to receive reflected electromagnetic radiation from the enclosed cavity; and a high-power RF amplifier coupled between the small signal generator and the RF feed. The high-power RF amplifier comprises: at least one amplifying stage configured to output a signal that is amplified in power with respect to the input RF signal; and a circulator for directing the amplified output signal to the RF feed and for redirecting any reflected waves and their associated power received from the RF feed to a dummy load. The system further comprises a hardware protection component for detecting backward power in the reflected electromagnetic radiation received by the RF feed and for reducing power supplied to the at least one amplifying stage if the backward power exceeds a power threshold within a time scale that prevents electrical stress or damage to the circulator.

In another aspect, a solid state radio frequency generation system is provided for an electromagnetic cooking device having an enclosed cavity in which a food load is placed. The solid state radio frequency generation system comprises: a small signal generator for generating an input RF signal; a plurality of RF feeds configured to introduce electromagnetic radiation into the enclosed cavity to heat up and prepare the food load, the plurality of RF feeds each configured to receive reflected electromagnetic radiation from the enclosed cavity; and a set of high-power RF amplifiers coupled to the plurality of RF feeds. Each high-power RF amplifier comprises: at least one amplifying stage configured to output a signal that is amplified in power with respect to the input RF signal; and a circulator for directing the amplified output signal to the RF feed and for redirecting any reflected waves and their associated power received from the RF feed to a dummy load. The system further comprises a hardware protection component for detecting backward power in the reflected electromagnetic radiation received by the plurality of RF feeds and for reducing power supplied to the plurality of high-power amplifiers if the backward power from any one of the plurality of RF feeds exceeds a power threshold within a time scale that prevents electrical stress or damage to the circulator of one of the plurality of high-power RF amplifiers.

In another aspect, an electromagnetic cooking device is provided comprising: an enclosed cavity in which a food load is placed; a small signal generator for generating an input RF signal; an RF feed configured to introduce electromagnetic radiation into the enclosed cavity to heat up and prepare the food load, the RF feed configured to receive reflected electromagnetic radiation from the enclosed cavity; and a high-power RF amplifier coupled between the small signal generator and the RF feed. The high-power RF amplifier comprises: at least one amplifying stage configured to output a signal that is amplified in power with respect to the input RF signal; and a circulator for directing the amplified output signal to the RF feed and for redirecting any reflected waves and their associated power received from the RF feed to a dummy load. The cooking device further comprises a hardware protection component for detecting backward power in the reflected electromagnetic radiation received by the RF feed and for reducing power supplied to the at least one amplifying stage if the backward power exceeds a power threshold within a time scale that prevents electrical stress or damage to the circulator.

DETAILED DESCRIPTION

Figure 1:
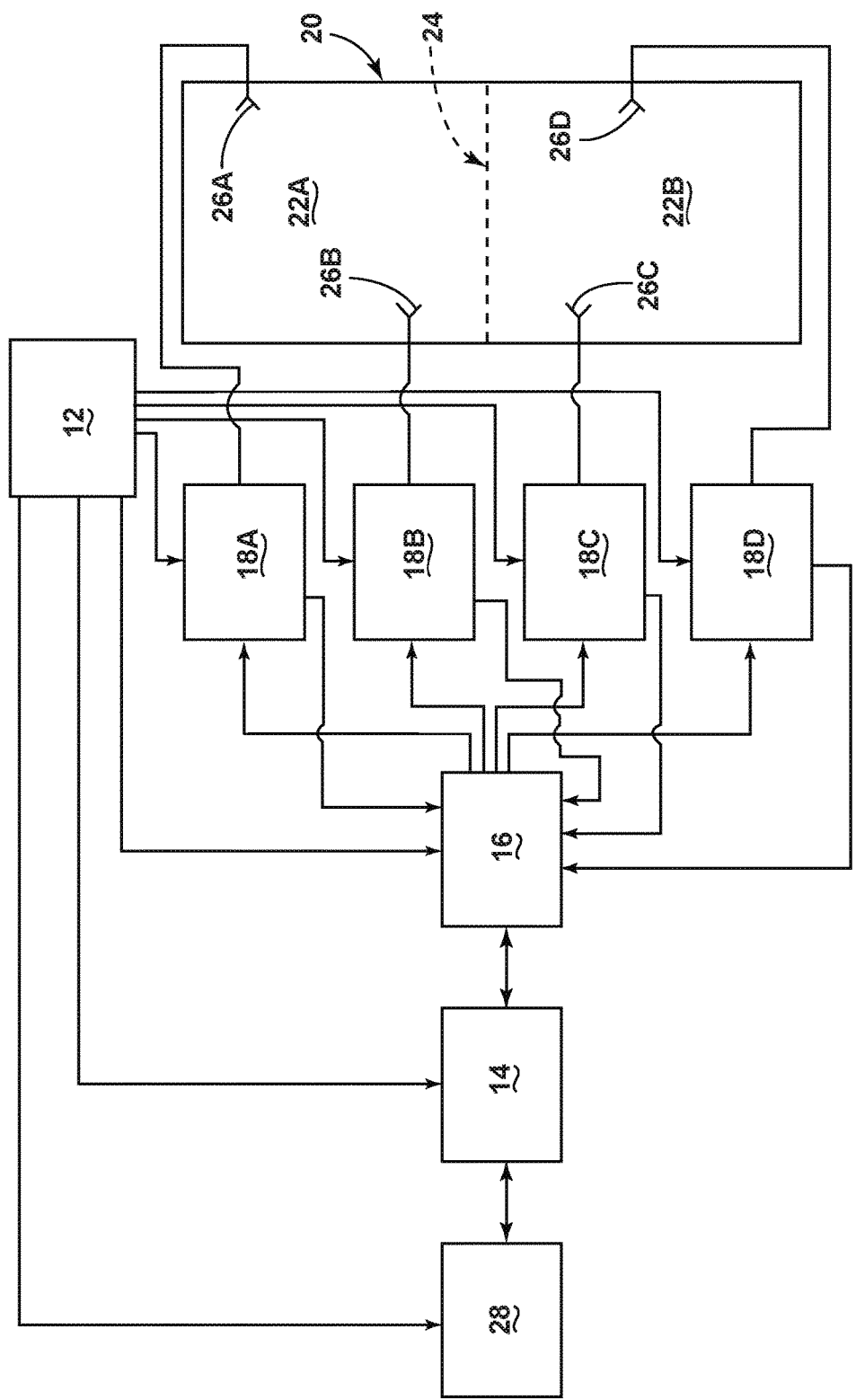
FIG. 1 is a block diagram of an electromagnetic cooking device with multiple coherent radio frequency feeds in accordance with various aspects described herein.

It is to be understood that the specific devices and processes illustrated in the attached drawings and described in the following specification are simply exemplary embodiments of the inventive concepts defined in the appended claims. Hence, other physical characteristics relating to the embodiments disclosed herein are not to be considered as limiting, unless the claims expressly state otherwise.

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape the wave patterns in the enclosed cavity, the multiple RF feeds can radiate waves with separately controlled electromagnetic characteristics to maintain coherence (that is, a stationary interference pattern) within the enclosed cavity. For example, each RF feed can transmit a different frequency, phase and/or amplitude with respect to the other feeds. Other electromagnetic characteristics can be common among the RF feeds. For example, each RF feed can transmit at a common but variable frequency. Although the following embodiments are directed to a cooking appliance where RF feeds direct electromagnetic radiation to heat an object in an enclosed cavity, it will be understood that the methods described herein and the inventive concepts derived therefrom are not so limited. The covered concepts and methods are applicable to any RF device where electromagnetic radiation is directed to an enclosed cavity to act on an object inside the cavity. Exemplary devices include ovens, dryers, steamers, and the like.

A common topology for a solid-state RF system is to include a small signal generator where the output power is generally lower than 1 W and one or more power amplifiers able to raise the power level to hundreds of watts. Power amplifiers with a maximum output power in the range of hundreds of watts (e.g. 250 W) are now available and are suited for heating applications like microwave ovens for replacing a magnetron. When the output power of a single power amplifier does not meet the requirements of the application, more power amplifiers can be added to the system; each injecting power simultaneously in the same cavity. To enable a multiple amplifier topology, the output signal of the small signal generator is distributed among the different power amplifiers, or the small signal generator must provide more than one small signal (i.e. multi-channel operation mode). Such amplifiers typically include integrated sensors to control the amplifiers and provide basic safety functions for the electronic components. The integrated sensors can read input and reflected power (i.e. power associated to backward travelling waves that occur when the load coupled to the amplifier is not a perfect match). The reading is performed using an integrated bi-directional coupler, external bi-directional couplers, four-wave reflectometers, indirect estimators or any other technique known in the art. Moreover, depending upon the implementation, the phase of the travelling waves, both forward and backward, can be read.

Cooking applications typically require power levels in the range of hundreds of watts. For example, a common power budget for a magnetron-based microwave oven is in the range of 800 to 1200 W. Nonetheless, not all applications require such a high power level. For example, a cooking application may require a power level as low as 80 W to ensure homogeneous heating. Nevertheless, many cooking processes are contemplated at high power levels. From an electromagnetic perspective, the food load represents a variable loading condition that is not typically an ideal load for the high power amplifiers. Consequently, during the cooking process, reflections occur where electromagnetic waves travel back from the microwave cavity to the high power amplifier. The reflected power can be in the range of hundreds of watts. Such high-power reflected electromagnetic waves can damage the high-power amplifier. In order to prevent such damage, a high-power rated circulator may be provided that redirects the backward power of the reflected electromagnetic waves to a dummy load that dissipates the reflected power as heat. Such high-power rated circulators have to withstand power in the range of hundreds of watts for a sustained period of time. These high-power rated circulators are costly.

The present embodiment relates to a hybrid design that combines the usage of a low-power rated circulator and fast hardware protection that is integrated into a high power amplifier. As shown and described in more detail below, a high-power amplifier can include a number of amplification stages coupled in series by a guiding structure to carry and amplify the signal from the amplifier input to the amplifier output. After the amplifier output, a low-power rated circulator is provided as a protection device. After the circulator and before feeding energy into the microwave cavity, a coupler structure is provided to measure the forward and reflected power. The coupler may be integrated into the high-power amplifier or may be integrated in the waveguide or any other feeding system depending upon the implementation. The function of the circulator is to redirect the reflected wave and its associated power to a dummy load (e.g. a resistor or other energy dissipating device) where energy is transformed into heat to be dissipated.

The present embodiment combines the low-power circulator and a hardware protection component that uses the power read by the coupler to trigger a protective measure that will either reduce the power or shut down the high power amplifier in a time scale that will prevent electrical stress or damage to the circulator. The hardware protection component can trigger within a time duration that is shorter than the maximum capability of the circulator to sustain a power condition exceeding its maximum ratings. The combined function of the low-power rated circulator and the hardware protection component will protect the circulator and the output stage transistor to effectively function as a high-power rated circulator. The hardware protection can include a trigger to broadcast a message to the RF generation system in order to further protect other high power amplifiers in concurrent use in the application.

Benefits of the hybrid protection system include lower costs for the circulator because it may be designed to sustain lower amounts of reflected power. Additional details of the hybrid protection system are described below following a general description of an electromagnetic cooking device in which the hybrid protection system may be used.

FIG. 1 shows a block diagram of an electromagnetic cooking device 10 with multiple coherent RF feeds 26A-D according to one embodiment. As shown in FIG. 1, the electromagnetic cooking device 10 includes a power supply unit 12, a controller 14, an RF signal generator 16, a human-machine interface 28 and multiple high-power RF amplifiers 18A-D coupled to the multiple RF feeds 26A-D. The multiple RF feeds 26A-D each transfer RF power from one of the multiple high-power RF amplifiers 18A-D into an enclosed cavity 20.

The power supply unit 12 provides electrical power derived from mains electricity to the controller 14, the RF signal generator 16, the human-machine interface 28 and the multiple high-power RF amplifiers 18A-D. The power supply 12 converts the mains electricity to the required power level of each of the devices it powers. The power supply 12 can deliver a variable output voltage level. For example, the power supply 12 can output a voltage level selectively controlled in 0.5-volt steps. In this way, the power supply 12 can be configured to typically supply 28 volts direct current to each of the high-power RF amplifiers 18A-D, but can supply a lower voltage, such as 15 volts direct current, to decrease an RF output power level by a desired level.

A controller 14 can be included in the electromagnetic cooking device 10, which can be operably coupled with various components of the electromagnetic cooking device 10 to implement a cooking cycle. The controller 14 can also be operably coupled with a control panel or human-machine interface 28 for receiving user-selected inputs and communicating information to a user. The human-machine interface 28 can include operational controls such as dials, lights, switches, touch screen elements, and displays enabling a user to input commands, such as a cooking cycle, to the controller 14 and receive information. The user interface 28 can include one or more elements, which can be centralized or dispersed relative to each other. The controller 14 may also select the voltage level supplied by power supply 12.

The controller 14 can be provided with a memory and a central processing unit (CPU), and can be preferably embodied in a microcontroller. The memory can be used for storing control software that can be executed by the CPU in completing a cooking cycle. For example, the memory can store one or more pre-programmed cooking cycles that can be selected by a user and completed by the electromagnetic cooking device 10. The controller 14 can also receive input from one or more sensors. Non-limiting examples of sensors that can be communicably coupled with the controller 14 include peak level detectors known in the art of RF engineering for measuring RF power levels and temperature sensors for measuring the temperature of the enclosed cavity or one or more of the high-power amplifiers 18A-D.

Based on the user input provided by the human-machine interface 28 and data including the forward and backward (or reflected) power magnitudes coming from the multiple high-power amplifiers 18A-D (represented in FIG. 1 by the path from each of the high-power amplifiers 18A-D through the RF signal generator 16 to the controller 14), the controller 14 can determine the cooking strategy and calculate the settings for the RF signal generator 16. In this way, one of the main functions of the controller 14 is to actuate the electromagnetic cooking device 10 to instantiate the cooking cycle as initiated by the user. The RF signal generator 16 as described below then can generate multiple RF waveforms, that is, one for each high-power amplifier 18A-D based on the settings indicated by the controller 14.

The high-power amplifiers 18A-D, each coupled to one of the RF feeds 26A-D, each output a high-power RF signal based on a low power RF signal provided by the RF signal generator 16. The low power RF signal input to each of the high-power amplifiers 18A-D can be amplified by transforming the direct current electrical power provided by the power supply 12 into a high-power radio frequency signal. In one non-limiting example, each high-power amplifier 18A-D can be configured to output an RF signal ranging from 50 to 250 Watts. The maximum output wattage for each high-power amplifier can be more or less than 250 Watts depending upon the implementation. Each high-power amplifier 18A-D can include a dummy load to absorb excessive RF reflections.

The multiple RF feeds 26A-D transfer power from the multiple high-power RF amplifiers 18A-D to the enclosed cavity 20. The multiple RF feeds 26A-D can be coupled to the enclosed cavity 20 in spatially separated but fixed physical locations. The multiple RF feeds 26A-D can be implemented via waveguide structures designed for low power loss propagation of RF signals. In one non-limiting example, metallic, rectangular waveguides known in the art are capable of guiding RF power from a high-power amplifier 18A-D to the enclosed cavity 20.

Additionally, each of the RF feeds 26A-D can include a sensing capability to measure the magnitude of the forward and the backward power levels or phase at the amplifier output. The measured backward power indicates a power level returned to the high-power amplifier 18A-D as a result of an impedance mismatch between the high-power amplifier 18A-D and the enclosed cavity 20. Besides providing feedback to the controller 14 and the RF signal generator 16 to implement, in part, a cooking strategy, the backward power level can indicate excess reflected power that can damage the high-power amplifier 18A-D.

The enclosed cavity 20 can selectively include subcavities 22A-B by insertion of an optional divider 24 therein. The enclosed cavity 20 can include, on at least one side, a shielded door to allow user access to the interior of the enclosed cavity 20 for placement and retrieval of food or the optional divider 24.

The transmitted bandwidth of each of the RF feeds 26A-D can include frequencies ranging from 2.4 GHz to 2.5 GHz. The RF feeds 26A-D can be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and can include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

Figure 2:
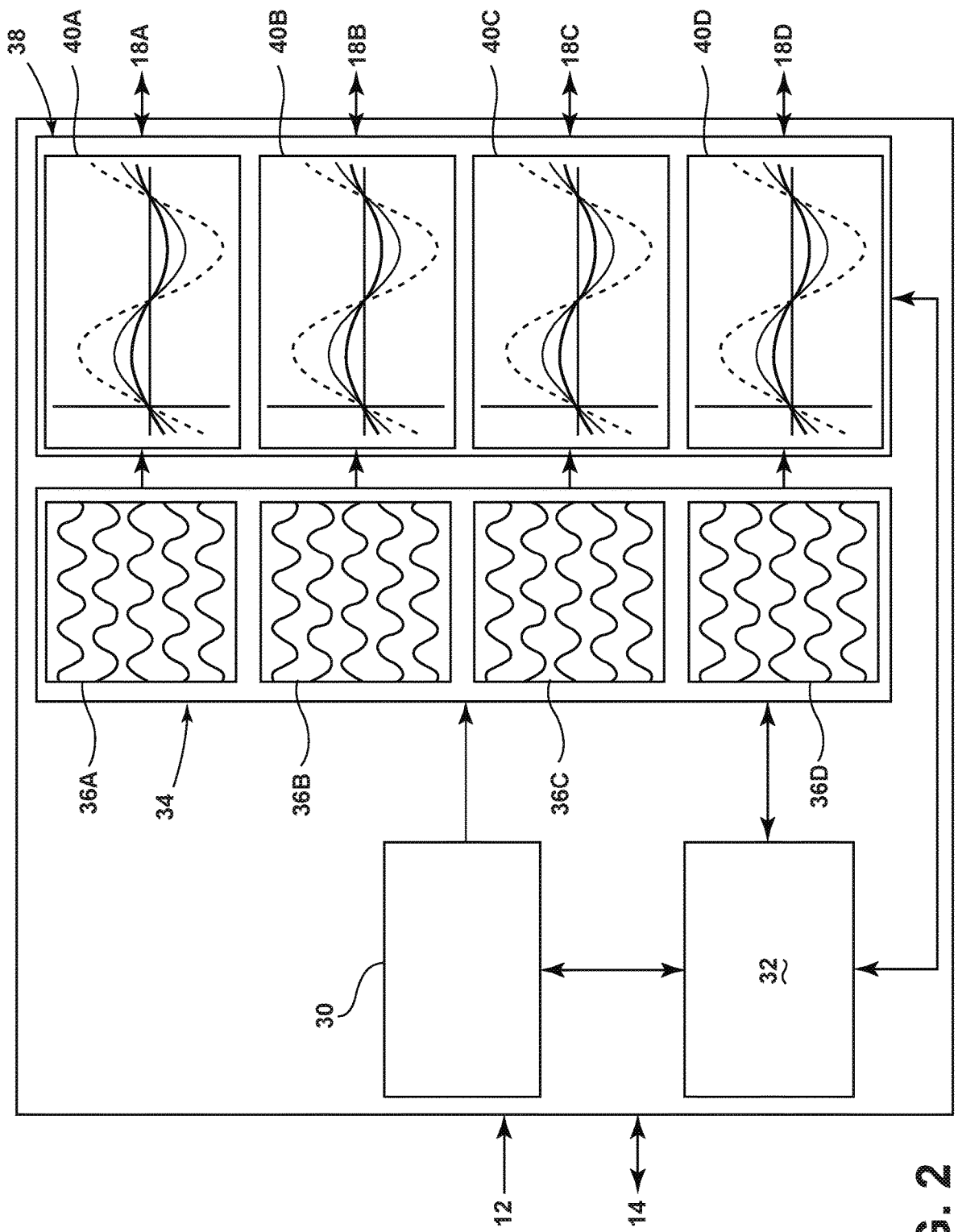
FIG. 2 is a block diagram of a radio frequency signal generator of FIG. 1.

Referring now to FIG. 2, a block diagram of the RF signal generator 16 is shown. The RF signal generator 16 includes a frequency generator 30, a phase generator 34 and an amplitude generator 38 sequentially coupled and all under the direction of an RF controller 32. In this way, the actual frequency, phases and amplitudes to be output from the RF signal generator 16 to the high-power amplifiers are programmable through the RF controller 32, preferably implemented as a digital control interface. The RF signal generator 16 can be physically separate from the cooking controller 14 or can be physically mounted onto or integrated into the controller 14. The RF signal generator 16 is preferably implemented as a bespoke integrated circuit.

As shown in FIG. 2 the RF signal generator 16 outputs four RF channels 40A-D that share a common but variable frequency (e.g. ranging from 2.4 GHz to 2.5 GHz), but are settable in phase and amplitude for each RF channel 40A-D. The configuration described herein is exemplary and should not be considered limiting. For example, the RF signal generator 16 can be configured to output more or less channels and can include the capability to output a unique variable frequency for each of the channels depending upon the implementation.

As previously described, the RF signal generator 16 can derive power from the power supply unit 12 and input one or more control signals from the controller 14. Additional inputs can include the forward and backward power levels determined by the high-power amplifiers 18A-D. Based on these inputs, the RF controller 32 can select a frequency and signal the frequency generator 30 to output a signal indicative of the selected frequency. As represented pictorially in the block representing the frequency generator 30 in FIG. 2, the selected frequency determines a sinusoidal signal whose frequency ranges across a set of discrete frequencies. In one non-limiting example, a selectable bandwidth ranging from 2.4 GHz to 2.5 GHz can be discretized at a resolution of 1 MHz allowing for 101 unique frequency selections.

After the frequency generator 30, the signal is divided per output channel and directed to the phase generator 34. Each channel can be assigned a distinct phase, that is, the initial angle of a sinusoidal function. As represented pictorially in the block representing the per channel phase generator 36A-D in FIG. 2, the selected phase of the RF signal for a channel can range across a set of discrete angles. In one non-limiting example, a selectable phase (wrapped across half a cycle of oscillation or 180 degrees) can be discretized at a resolution of 10 degrees allowing for 19 unique phase selections per channel.

Subsequent to the phase generator 34, the RF signal per channel can be directed to the amplitude generator 38. The RF controller 32 can assign each channel (shown in FIG. 2 with a common frequency and distinct phase) to output a distinct amplitude in the channel 40A-D. As represented pictorially in the block representing the per channel amplitude generator 38 in FIG. 2, the selected amplitude of the RF signal can range across a set of discrete amplitudes (or power levels). In one non-limiting example, a selectable amplitude can be discretized at a resolution of 0.5 decibels across a range of 0 to 23 decibels allowing for 47 unique amplitude selections per channel.

The amplitude of each channel 40A-D can be controlled by one of several methods depending upon the implementation. For example, control of the supply voltage of the amplitude generator 38 for each channel can result in an output amplitude for each channel 40A-D from the RF signal generator 16 that is directly proportional to the desired RF signal output for the respective high-power amplifier 18A-D. Alternatively, the per channel output can be encoded as a pulse-width modulated signal where the amplitude level is encoded by the duty cycle of the pulse-width modulated signal. Yet another alternative is to coordinate the per channel output of the power supply unit 12 to vary the supply voltage supplied to each of the high-power amplifiers 18A-D to control the final amplitude of the RF signal transmitted to the enclosed cavity 20.

As described above, the electromagnetic cooking device 10 can deliver a controlled amount of power at multiple RF feeds 26A-D into the enclosed cavity 20. Further, by maintaining control of the amplitude, frequency and phase of the power delivered from each RF feed 26A-D, the electromagnetic cooking device 10 can coherently control the power delivered into the enclosed cavity 20. Coherent RF sources deliver power in a controlled manner to exploit the interference properties of electromagnetic waves. That is, over a defined area of space and duration of time, coherent RF sources can produce stationary interference patterns such that the electric field is distributed in an additive manner. Consequently, interference patterns can add to create an electromagnetic field distribution that is greater in amplitude than any of the RF sources (i.e. constructive interference) or less than any of the RF sources (i.e. destructive interference).

The coordination of the RF sources and characterization of the operating environment (i.e. the enclosed cavity and the contents within) can enable coherent control of the electromagnetic cooking and maximize the coupling of RF power with an object in the enclosed cavity 20. Efficient transmission into the operating environment can require calibration of the RF generating procedure. As described above, in an electromagnetic heating system, the power level can be controlled by many components including the voltage output from the power supply unit 12, the gain on stages of variable gain amplifiers including both the high-power amplifiers 18A-D and the amplitude generator 38, the tuning frequency of the frequency generator 30, etc. Other factors that affect the output power level include the age of the components, inter-component interaction and component temperature.

Figure 3:
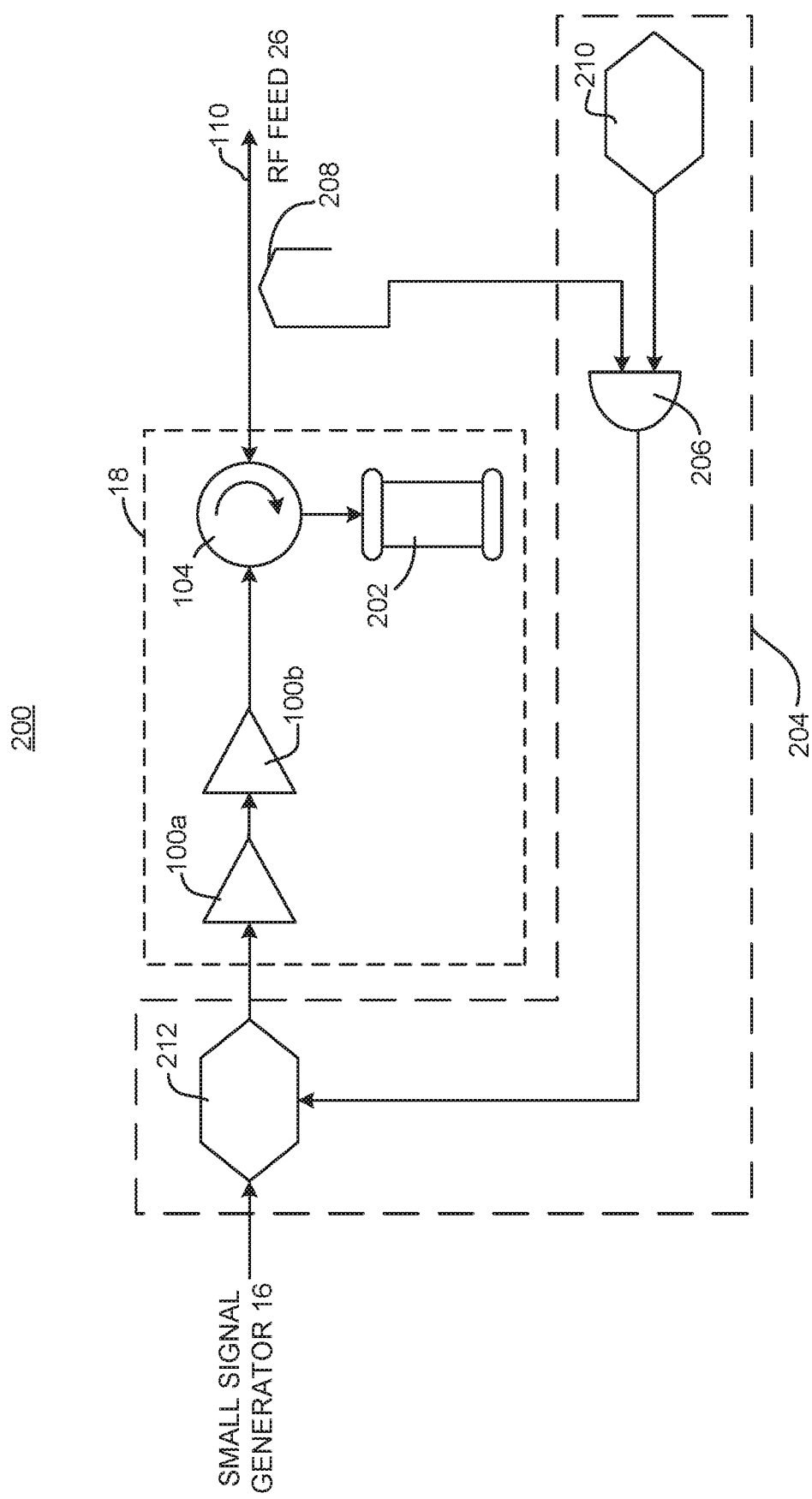
FIG. 3 is an electrical circuit diagram of an RF energy transmission system according to one embodiment.

FIG. 3 shows an electrical circuit diagram of an RF energy transmission system 200. The RF energy transmission system 200 includes the high-power amplifier 18, which is coupled between the small signal generator 16 (FIG. 1) and the RF feed 26 (FIG. 1). The high-power amplifier 18 may include at least one amplifying stage 100a, 100b configured to output a signal that is amplified in power with respect to the input RF signal from the signal generator 16, and the low-power rated circulator 104, which directs the amplified output signal to the RF feed and redirects any reflected waves and their associated power received from the RF feed to a dummy load 202. The RF energy transmission system 200 may further comprise a hardware protection component 204 for detecting backward power in the reflected electromagnetic radiation received by the RF feed 26 and reducing power supplied to the at least one amplifying stage 100a, 100b if the backward power exceeds a power threshold within a time scale that prevents electrical stress or damage to the low-power rated circulator 104. This time scale is shorter than a maximum capability of the circulator to sustain a power condition exceeding its maximum ratings.

The circulator 104 is a low-power rated circulator. This means that, for a multi-port system, the circulator has a maximum rating of that is less than the maximum backward power, which it may sustain for less than about 10 nanoseconds. Circulators may suffer two different stresses: electrical stress, due to the forward power and the vectorial sum of forward and reflected waves (in principle with arbitrary phase relation) and thermal stress, due to the power the circulator has to dissipate, which are the sum of the insertion losses caused by the forward and reflected power flowing through it. The time constant of E-field stress is in the nanosecond time frame while the time constant of thermal stress is tenths of seconds time frame. Because of the much more rapid effects of electrical stress, the thermal effects are not as significant of a problem as the solution described herein will stop the source of thermal stress well before it could become a problem. Electrical field stress, however, could cause damage to the hardware if the field strength exceeds the specified rating for which the circuitry and components (i.e., the circulator). By math, the forward power $P_{fwd}$ and the reflected power $P_{bwd}$, in a multi-port system where multiple amplifiers are providing energy to the cavity and then to the load, the worst case of $P_{bwd}$ is provided by the following formula:

$$P_{bwd}=P_{fwd}(n-1)$$

where n is the number of sources (HPA) injecting energy into the cavity.

With this premise, in a 4-port system with 4 high-power amplifiers of 250 W each, for example, the maximum $P_{bwd}$ can be 750 W. In prior systems, it is the backward power $P_{bwd}$ that drives the selection of the circulator rating. Thus, in the prior systems, one would have used a circulator rated at least as high as the maximum $P_{bwd}$, which would be at least 750 W in the example above. By utilizing the features described herein, one may reduce the ratings requirement (and consequently the cost) of the circulator, as the additional hardware protection described below will take care of fast (<10 ns) power reduction/power cut thereby protecting the circulator 104 from damage. Thus, for use in a 4-port system with 250 W high-power amplifiers 18, the circulator 104 can be rated at less than 750 W or even as low as 250 W independent from the number of high-power amplifiers 18 contemporary connected to the cavity and simultaneously providing energy to the food load. More generically, the quick response time scale in which the hardware protection component 204 acts, allows the power rating of the circulator to be selected in accordance to the forward power and independent from the number of ports.

The hardware protection component 204 includes a comparator 206 for comparing the backward power to the power threshold. The backward power may be provided to the comparator 206 from a coupler 208. The coupler 208 is provided to measure the forward and reflected power. The coupler 208 may be integrated into the high-power amplifier 18 or may be integrated in the waveguide 110 or any other RF feed 26 depending upon the implementation.

The power threshold may be adjusted using a power threshold adjustment 210. The hardware protection component 204 further includes a power control 212 coupled to an output of the comparator 206 for reducing the power supplied to the at least one amplifier stage 100a, 100b when the output of the comparator 206 represents that the backward power exceeds the power threshold. The power control 212 may reduce the power supplied to the at least one amplifier stage 100a, 100b by interrupting the supply of power to the at least one amplifier stage 100a, 100b altogether. This may be accomplished using a switch that interrupts the supply of power in response to the output of the comparator 206. Alternatively, the power control 212 may reduce the power supplied to the at least one amplifier stage 100a, 100b by decreasing the power without interrupting the supply of power altogether. By utilizing the hardware protection component 204 constructed as described above, the power supplied to the high-power amplifier 18 may be quickly reduced or interrupted in response to the backward power exceeding the power threshold before the maximum power rating of the circulator is exceeded. The hardware protection component 204 is much quicker to respond to changes in the backward power than when the backward power is passed through an ADC and then to a microprocessor that must first process the measured backward power and generate a control signal. Further, by having a quicker response time, the circulator 104 may have a lower power rating and thus be less expensive to implement while still providing the benefit of protecting the high-power amplifier 18.

The output of the comparator 206 and/or the coupler 208 may also be used to trigger other responses from controller 14, RF controller 32, or signal generator 16 so as to enact other measures to prevent damage to the system.

The high-power amplifier 18 is configured such that a number of amplification stages 100a, 100b are interconnected to amplify a radio frequency signal from the amplifier input to the amplifier output. Depending upon the configuration of the circuit, the amplification stages 100a, 100b can produce a current gain, a voltage gain or both.

As described above, the output of the amplification stages 100a, 100b is coupled to the circulator 104. The low-power rated circulator 104 may be a passive multi-port component that transmits radio frequency signals from one port to the next where a port is a point on the low-power rated circulator 104 for coupling a radio frequency signal from one component to another. The circulator 104 acts as a protective device to isolate the amplification stages 100a, 100b from deleterious effects that can occur when a mismatched load reflects power.

The circulator 104 may be of any form such as a drop-in standalone circulator or an integrated circulator that is integrated into the high-power amplifier as described in WO 2016/196939 A1, the entire disclosure of which is incorporated herein by reference.

Although only one high-power amplifier 18 is shown in FIG. 3, the hybrid protection may be provided for each of the plurality of high-power amplifiers 18A-18D that may be used in the electromagnetic cooking device 10. In such a case, when the backward power sensed at any one of the RF feeds 26A-26D exceeds the power threshold, the power supplied to all of the high-power amplifiers 18A-18D may be reduced or interrupted.

For the output power level at the end of the amplification stages 100a, 100b to hit a desired set-point level, the RF signal generator (cf. element 16 in FIG. 1) can rely on feedback in the form of signals indicative of the forward and backward power levels of the radio frequency signals conveyed to the enclosed cavity (cf. element 20 in FIG. 1). Therefore, in addition to the amplifying components for outputting a radio frequency signal that is amplified in power with respect to an input radio frequency signal, conventional high-power amplifiers can include either a scalar or a vectorial measuring component that outputs a signal indicative of the radio frequency power transmitted and received by the amplifying component.

The RF energy transmission system 200 can also include any components useful for measuring the phase of a radio frequency signal including, but not limited to, a bi-directional coupler containing matched calibrated detectors or a pair of single-detector couplers oriented so as to measure the electrical power flowing in both directions within the waveguide 110. In this way, the measurement system can characterize the radio frequency transmissions according to power and phase and can be used to form a networked description as embodied in the scattering matrix or S-parameters.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of properties, colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above are merely for illustrative purposes and not intended to limit the scope of the device, which is defined by the following claims as interpreted according to the principles of patent law, including the Doctrine of Equivalents.

What is claimed is:

1. A solid state radio frequency generation system, for an electromagnetic cooking device having an enclosed cavity in which a food load is placed, the solid state radio frequency generation system comprising:
    a small signal generator for generating an input RF signal;
    an RF feed configured to introduce electromagnetic radiation into the enclosed cavity to heat up and prepare the food load, the RF feed configured to receive reflected electromagnetic radiation from the enclosed cavity;
    a high-power RF amplifier coupled between the small signal generator and the RF feed, the high-power RF amplifier comprising:
        at least one amplifying stage configured to output a signal that is amplified in power with respect to the input RF signal; and
        a circulator for directing the amplified output signal to the RF feed and for redirecting any reflected waves and their associated power received from the RF feed to a dummy load; and
    a hardware protection component for detecting backward power in the reflected electromagnetic radiation received by the RF feed and for reducing power supplied to the at least one amplifying stage if the backward power exceeds a power threshold within a time scale that prevents electrical stress or damage to the circulator,
    wherein the circulator has a maximum power rating of less than a maximum backward power to which the circulator could be exposed.

2. The solid state radio frequency generation system of claim 1, wherein the time scale is shorter than a maximum capability of the circulator to sustain a power condition exceeding its maximum rating.

3. The solid state radio frequency generation system of claim 1, wherein the time scale is less than 10 nanoseconds.

4. The solid state radio frequency generation system of claim 1, wherein the hardware protection component comprises a comparator for comparing the backward power to the power threshold, wherein the power threshold is adjustable.

5. The solid state radio frequency generation system of claim 3, wherein the hardware protection component further comprises a power control coupled to an output of the comparator for reducing the power supplied to the at least one amplifier stage when the output of the comparator represents that the backward power exceeds the power threshold.

6. The solid state radio frequency generation system of claim 5, wherein the power control reduces the power supplied to the at least one amplifier stage by interrupting the supply of power to the at least one amplifier stage.

7. A solid state radio frequency generation system for an electromagnetic cooking device having an enclosed cavity in which a food load is placed, the solid state radio frequency generation system comprising:
    a small signal generator for generating an input RF signal;
    a plurality of RF feeds configured to introduce electromagnetic radiation into the enclosed cavity to heat up and prepare the food load, the plurality of RF feeds each configured to receive reflected electromagnetic radiation from the enclosed cavity;
    a set of high-power RF amplifiers coupled to the plurality of RF feeds, each high-power RF amplifier comprising:
        at least one amplifying stage configured to output a signal that is amplified in power with respect to the input RF signal; and
        a circulator for directing the amplified output signal to the RF feed and for redirecting any reflected waves and their associated power received from the RF feed to a dummy load; and
    a hardware protection component for detecting backward power in the reflected electromagnetic radiation received by the plurality of RF feeds and for reducing power supplied to the plurality of high-power amplifiers if the backward power from any one of the plurality of RF feeds exceeds a power threshold within a time scale that prevents electrical stress or damage to the circulator of one of the plurality of high-power RF amplifiers,
    wherein the circulator of each of the plurality of high-power RF amplifiers has a maximum power rating of less than a maximum backward power to which the circulator could be exposed.

8. The solid state radio frequency generation system of claim 7, wherein the time scale is shorter than a maximum capability of the circulator to sustain a power condition exceeding its maximum rating.

9. The solid state radio frequency generation system of claim 7, wherein the time scale is less than 10 nanoseconds.

10. The solid state radio frequency generation system of claim 7, wherein the hardware protection component comprises a comparator for comparing the backward power to the power threshold, wherein the power threshold is adjustable.

11. The solid state radio frequency generation system of claim 10, wherein the hardware protection component further comprises a power control coupled to an output of the comparator for reducing the power supplied to each of the plurality of high-power RF amplifiers when the output of the comparator represents that the backward power exceeds the power threshold.

12. The solid state radio frequency generation system of claim 11, wherein the power control reduces the power supplied to each of the plurality of high-power RF amplifiers by interrupting the supply of power to each of the plurality of high-power RF amplifiers.

13. An electromagnetic cooking device comprising:
    an enclosed cavity in which a food load is placed;
    a small signal generator for generating an input RF signal;
    an RF feed configured to introduce electromagnetic radiation into the enclosed cavity to heat up and prepare the food load, the RF feed configured to receive reflected electromagnetic radiation from the enclosed cavity;

a high-power RF amplifier coupled between the small signal generator and the RF feed, the high-power RF amplifier comprising:

at least one amplifying stage configured to output a signal that is amplified in power with respect to the input RF signal; and a circulator for directing the amplified output signal to the RF feed and for redirecting any reflected waves and their associated power received from the RF feed to a dummy load; and a hardware protection component for detecting backward power in the reflected electromagnetic radiation received by the RF feed and for reducing power supplied to the at least one amplifying stage if the backward power exceeds a power threshold within a time scale that prevents electrical stress or damage to the circulator, wherein the circulator has a maximum power rating of less than a maximum backward power to which the circulator could be exposed.

14. The electromagnetic cooking device of claim 13, wherein the time scale is shorter than a maximum capability of the circulator to sustain a power condition exceeding its maximum rating.

15. The electromagnetic cooking device of claim 13, wherein the time scale is less than 10 nanoseconds.

16. The electromagnetic cooking device of claim 13, wherein the hardware protection component comprises a comparator for comparing the backward power to the power threshold, wherein the power threshold is adjustable.

17. The electromagnetic cooking device of claim 16, wherein the hardware protection component further comprises a power control coupled to an output of the comparator for reducing the power supplied to the at least one amplifier stage when the output of the comparator represents that the backward power exceeds the power threshold.

* * * * *